United States Patent [19]

Mroczek et al.

[11] 3,893,154

[45] July 1, 1975

[54] SEMICONDUCTOR ARRANGEMENT WITH CURRENT STABILIZING RESISTANCE

[75] Inventors: Werner Mroczek, Heilbronn; Josef Wolf, Leingarten, both of Germany

[73] Assignee: Licentia Patent-Verwaltungs-G.m.b.H., Frankfurt/Main, Germany

[22] Filed: Oct. 19, 1973

[21] Appl. No.: 407,817

[30] Foreign Application Priority Data

Oct. 21, 1972 Germany ............................ 2251727

[52] U.S. Cl. ....................... 357/35; 357/28; 357/36; 357/71; 357/67

[51] Int. Cl. ............................. H01l 3/00; H01l 5/00

[58] Field of Search ....... 317/235, 40.13, 29, 40.12, 317/235, 5.2, 5.3

[56] References Cited

UNITED STATES PATENTS

| | | | |
|---|---|---|---|
| 3,256,587 | 6/1966 | Hangstefer | 317/234 M |
| 3,358,197 | 12/1967 | Scarlett | 317/235 Z |
| 3,462,658 | 8/1969 | Worchel et al. | 317/235 Z |
| 3,504,239 | 3/1970 | Johnson et al. | 317/235 Q |
| 3,562,607 | 2/1971 | Iersel | 317/235 Z |
| 3,585,414 | 6/1971 | Ghezzo | 317/234 |
| 3,600,646 | 8/1971 | Brackelmanns | 317/235 Z |
| 3,614,480 | 10/1971 | Berglund | 317/235 Q |
| 3,667,008 | 5/1972 | Katnack | 317/235 Y |
| 3,740,621 | 6/1973 | Carley | 317/235 Y |

*Primary Examiner*—Andrew J. James
*Attorney, Agent, or Firm*—Spencer & Kaye

[57] ABSTRACT

A semiconductor arrangement comprises two regions of different types of conductivity in a semiconductor body, one of the regions forming a pn junction which extends to a surface of the semiconductor body on which an insulating layer is provided, a ohmic contact on this said latter region only along its entire edge and a resistance between the ohmic contact and a current feed contact for said latter region.

7 Claims, 1 Drawing Figure

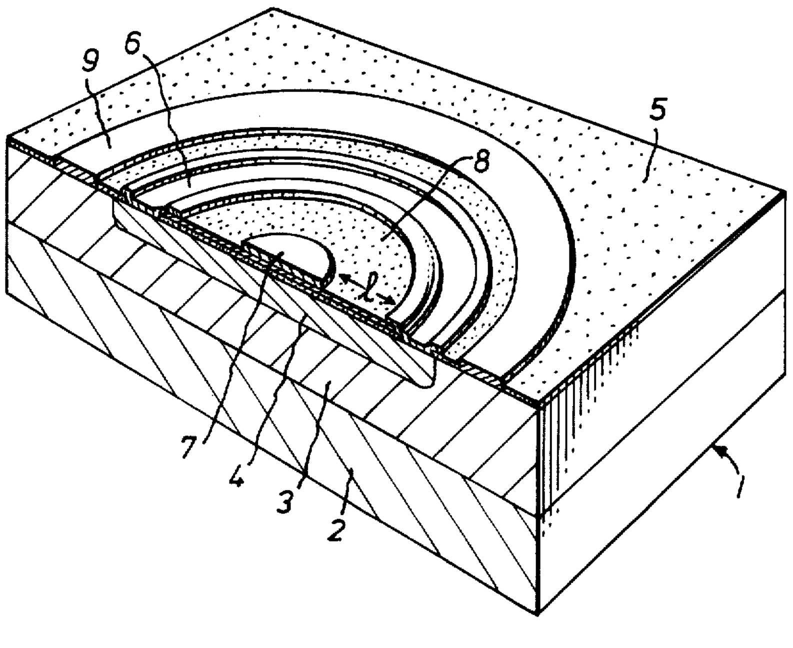
9
6
5
8
l
7
4
3
2
1

SEMICONDUCTOR ARRANGEMENT WITH CURRENT STABILIZING RESISTANCE

BACKGROUND OF THE INVENTION

The invention relates to a semiconductor arrangement with at least two regions of opposite type of conductivity of which at least one extends to a surface, covered by an insulating layer, of the semiconductor body.

It is known that in the case of semiconductor components, particularly in the case of power transistors at high currents, current pinch-in can occur, which is concentrated at a certain spot. The semiconductor component is thermally greatly overloaded and irreversibly damaged by such a current pinch-in.

SUMMARY OF THE INVENTION

It is an object of the invention to prevent current pinch-in and to provide a current stabilized semiconductor component.

According to a first aspect of the invention, there is provided a semiconductor arrangement with at least two regions of opposite type of conductivity, of which at least one form a pn junction which extends to a major surface, covered by an insulating layer, of the semiconductor body, characterized in that the region extending to said surface covered with said insulating layer is provided with an ohmic connecting contact only at its outer edge, which contact is connected to a current feed by means of a resistance.

According to a second aspect of the invention, there is provided a semiconductor arrangement comprising a semiconductor body, a first region of a first type of conductivity in said semiconductor body, a second region of a second type of conductivity in said semiconductor body and extending to the surface of said semiconductor body, an insulating layer on said surface of said semiconductor body, an ohmic connecting contact for said second region current feed means for feeding current to said second region and a resistance between said ohmic connecting contact and said current feed means.

BRIEF DESCRIPTION OF THE DRAWING

The invention will now be described in greater detail, by way of example, with reference to the drawing, the single FIGURE of which is a perspective view, partly in section of one form of semiconductor arrangement in accordance with the invention.

DESCRIPTION OF THE PREFERRED EMBODIMENT

Basically, the invention proposes that the region extending to the surface side in the above mentioned semiconductor arrangement and covered with the insulating layer, is provided at only its outermost edge with an ohmic connecting contact, which is connected to a current feed through a resistance.

The ohmic connecting contact extends preferably over the entire length of the region edge, the shortest spacing between the connecting contact and the current feed being the same size at all points. The ohmic connecting contact is then connected through a coherent layer of resistance material, arranged on the insulating layer, to the current feed. The connecting contact itself preferably comprises resistance material, so that in the case of threatening current pinch-in current in an unlimited level cannot flow into the endangered spot even by means of this contact.

In the case of the region contacted in the above-mentioned manner, this is preferably the emitter region of a transistor, particularly of a power transistor. If such transistors are driven in the forward direction at the emitter-base pn-junction, the current emitted by the emitter region is usually concentrated in the edge region of the emitter. This is to be attributed to the voltage drop of the base current across the base bulk resistance under the emitter region. Because of this fact special efforts are made during the production of power transistors to increase the edge length of the emitter regions, since the possible currents can be substantially increased in this way. The emitter regions of power transistors therefore have multiply branched or comb-shaped structures, which are all distinguished by large emitter edge lengths.

If the emitter-base pn-junction is stressed in the reverse direction, there exists the danger, in the case of high reverse collector voltages, that, as the reverse voltage is maintained longer, the voltage breaks down and a secondary disruptive charge occurs in the center of the emitter region. This danger is eliminated in the arrangement in accordance with the invention, since the reverse current must divide towards the edges of the emitter regions, so that current concentration in the center of the emitter region is excluded.

Even in the case of a stressing of the base-emitter pn-junction in the forward direction it is a question, in the case of the known transistors, at high current, of a current pinch-in at an edge position of the emitter regions. Now the resistance between the ohmic connecting contact and the emitter-current feed and the resistance of the connecting contact itself counteracts this current pinch-in. The entire value of the resistance between the connection contact and current feed does in fact, in all lie only in the mOhm region yet in the case of a beginning concentration of the current formed at one point, the differential resistance at this point becomes especially effective. The differential resistance then is substantially relatively large and produces such a voltage drop across this resistance that thermal destruction of the element is impossible. The resistance between the connecting contact and the current feed thus acts in a current stabilizing manner and counteracts the current pinch-in.

Referring now to the drawing, this shows a power transistor in section. The transistor comprises a semiconductor body 1, the substrate 2 of which forms the collector region. A surface layer 3 of the semiconductor body forms the base region, into which the emitter region 4 is let from the major surface, for example, by diffusion. The emitter-base pn junction extends to the semiconductor body major surface which is covered with an insulation layer 5. In the case of the arrangement shown, it is a question of a transistor with a relatively large emitter region width. The emitter region is for instance 100 $\mu$m wide. The insulating layer 5 comprises, in the case of a silicon transistor, for example, silicon dioxide. In the insulating layer on the edge of the emitter region apertures were formed, in which the emitter connection contact was applied to the emitter region. This connection contact 6 comprises, for example, the resistance material nickel-chromium and extends to the resistance layer 8, which covers the part of the insulating layer not enclosed by the connection contact 6. This resistance layer is, for example 0.1 μm thick and likewise comprises nickel-chromium (20% chromium). The emitter current feed terminal 7, which on all sides has a spacing *l* is arranged on this resistance layer 8 in a central position. The value of the resistance between the connection contact and the current feed terminal 7 is dependent on the length *l* and can be varied by changing the dimension and/or by changing the thickness of the resistance layer 8. In one exemplary embodiment the entire resistance amounted to approximately 10–100 mOhm. In the case of the arrangement according to the drawing, the emitter connection contact 6 is constructed annularly and surrounds the current feed terminal 7 lying in the center point of the ring. The contact ring of the emitter is, for example, surrounded by a further contact ring 9, which forms the base connection.

Instead of the arrangement shown in the drawing, it can be a question of a transistor component with a branched emitter structure. Thus transistors are known in which the emitter region is made comb-shaped, "Christmas tree shaped", or star-shaped. Also in the case of these arrangements the actual connection contact only follows the edge of the emitter region corresponding to the teaching in accordance with the invention, whereas in the central position between the edges of the emitter region, lying opposite each other, the current feed is arranged on the resistance layer which connects contact and current feed together electrically.

It will be understood that the above description of the present invention is susceptible to various modifications, changes and adaptations.

What is claimed is:

1. In a semiconductor device including a semiconductor body having at least two regions of alternatingly opposite conductivity type with at least one of said regions forming a pn junction which extends to a major surface of said semiconductor body, an insulating layer on said major surface, and a contact ohmically connected to said one region via an aperture in said insulating layer, the improvement wherein said contact is formed of resistance material, is connected to said one region only at its outer edge and extends along the entire length of said edge of said one region; and further comprising a current feed terminal for said one region connected to said contact by a resistance formed of a coherent layer of resistance material on said insulating layer, said current feed terminal being connected to said layer of resistance material at a position such that the shortest spacing between said current feed terminal and said contact via said layer of resistance material is the same at all points.

2. A semiconductor arrangement as defined in claim 1, wherein said at least one region comprises a planar type emitter region of a transistor.

3. A semiconductor arrangement as defined in claim 2, wherein the part of said insulating layer covering said emitter region surrounded by said contact is covered with said layer of resistance material and said current feed terminal is arranged in a centre position on this resistance layer.

4. A semiconductor arrangement as defined in claim 3, wherein the resistance material of said ohmic contact and said resistance layer covering said insulating layer comprises nickel-chromium.

5. A semiconductor arrangement as defined in claim 2, wherein the resistance between said emitter contact and said emitter current feed terminal has a value of between approximately 10–100 mOhm.

6. A semiconductor arrangement as defined in claim 2, wherein said at least one region which is on the outer edge is the emitter region of a power transistor.

7. A semiconductor arrangement as defined in claim 3 wherein said emitter region is circular and said contact is annular.

* * * * *